United States Patent
Dehe et al.

(10) Patent No.: US 10,433,070 B2
(45) Date of Patent: Oct. 1, 2019

(54) SENSITIVITY COMPENSATION FOR CAPACITIVE MEMS DEVICE

(71) Applicant: Infineon Technologies AG, Neubiberg (DE)

(72) Inventors: Alfons Dehe, Reutlingen (DE); Abidin Güçlü Onaran, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/910,390

(22) Filed: Mar. 2, 2018

(65) Prior Publication Data

US 2019/0273993 A1 Sep. 5, 2019

(51) Int. Cl.
*H04R 19/04* (2006.01)
*B81B 3/00* (2006.01)
*B81C 1/00* (2006.01)
*H04R 19/00* (2006.01)
*H04R 7/04* (2006.01)

(52) U.S. Cl.
CPC ........... *H04R 19/04* (2013.01); *B81B 3/0056* (2013.01); *B81C 1/00166* (2013.01); *H04R 7/04* (2013.01); *H04R 19/005* (2013.01); *B81B 2201/0235* (2013.01); *B81B 2201/0257* (2013.01); *B81B 2201/0264* (2013.01); *B81B 2203/0127* (2013.01); *B81B 2203/0361* (2013.01); *B81B 2203/04* (2013.01); *H04R 2201/003* (2013.01)

(58) Field of Classification Search
CPC . H04R 7/04; H04R 7/08; H04R 19/01; H04R 19/02; H04R 19/005; H04R 19/04; H04R 2201/003; B81C 1/00166; B81B 3/0056; B81B 2201/0235; B81B 2201/0257; B81B 2201/0264; B81B 2203/0127; B81B 2203/0361; B81B 2203/04
See application file for complete search history.

(56) References Cited

U.S. PATENT DOCUMENTS

| | | | |
|---|---|---|---|
| 1,713,006 A * | 5/1929 | Round | H04R 9/00 381/400 |
| 3,778,561 A * | 12/1973 | Reedyk | H04R 19/016 381/113 |
| 4,532,383 A * | 7/1985 | Willy | G10K 13/00 181/157 |
| 9,181,080 B2 | 11/2015 | Dehe et al. | |
| 2015/0256913 A1* | 9/2015 | Dehe | H04R 1/08 381/176 |
| 2016/0221822 A1* | 8/2016 | Krumbein | H04R 23/00 |

OTHER PUBLICATIONS

Huang, C-H., et al., "Implementation of the CMOS MEMS Condenser Microphone with Corrugated Metal Diaphragm and Silicon Back-Plate," Open Access Sensors, ISSN 1424-8220, www.mdpi,com/journal/sensors Jun. 10, 2011, pp. 6257-6269.
Scheeper, P.P., et al., "Review Paper: A Review of Silicon Microphones," Sensors and Actuators A 44, Feb. 22, 1994, pp. 1-11.

\* cited by examiner

*Primary Examiner* — Joshua Kaufman
(74) *Attorney, Agent, or Firm* — Slater Matsil, LLP

(57) ABSTRACT

A MEMS device includes a membrane and a counter electrode structure spaced apart from the membrane. The counter electrode structure includes a non-planar conductive layer. The MEMS device includes an air gap between the membrane and the counter electrode structure. The air gap has a non-uniform thickness.

20 Claims, 9 Drawing Sheets

SENSITIVITY COMPENSATION FOR CAPACITIVE MEMS DEVICE

TECHNICAL FIELD

Embodiments of the invention relate to a microelectromechanical system (MEMS) device. Some embodiments relate to capacitive MEMS devices, such as a MEMS microphone and a MEMS sound transducer. Some embodiments relate to a vacuum microphone and/or a vacuum speaker.

BACKGROUND

Transducers convert signals from one domain to another and are often used in sensors. One common sensor with a transducer that is seen in everyday life is a microphone that converts sound waves to electrical signals. Another example of a common sensor is a thermometer. Various transducers exist that serve as thermometers by transducing temperature signals into electrical signals.

Microelectromechanical system (MEMS) based sensors include a family of transducers produced using micromachining techniques. MEMS, such as a MEMS microphone, gather information from the environment by measuring the change of physical state in the transducer and transferring a transduced signal to processing electronics that are connected to the MEMS sensor. MEMS devices may be manufactured using micromachining fabrication techniques similar to those used for integrated circuits.

MEMS devices may be designed to function as, for example, oscillators, resonators, accelerometers, gyroscopes, pressure sensors, microphones, and micro-mirrors. Many MEMS devices use capacitive sensing techniques for transducing the physical phenomenon into electrical signals. In such applications, the capacitance change in the sensor is converted to a voltage signal using interface circuits.

One such capacitive sensing device is a MEMS microphone. A MEMS microphone generally has a deflectable membrane separated by a small distance from a rigid backplate. In response to a sound pressure wave incident on the membrane, it deflects towards or away from the backplate, thereby changing the separation distance between the membrane and backplate. Generally, the membrane and backplate are made out of conductive materials and form "plates" of a capacitor. Thus, as the distance separating the membrane and backplate changes in response to the incident sound wave, the capacitance changes between the "plate" and an electrical signal is generated.

MEMS microphones are often used in mobile electronics, such as tablet computers or mobile phones. In some applications, it may be desirable to increase the functionality of these MEMS microphones in order to provide additional or improved functionality to the electronic system including the MEMS microphone, such as a tablet computer or mobile phone, for example.

SUMMARY

In accordance with an embodiment, a MEMS device includes a membrane and a counter electrode structure spaced apart from the membrane. The counter electrode structure includes a non-planar conductive layer. The MEMS device further includes an air gap between the membrane and the counter electrode structure. The air gap has a non-uniform thickness.

In accordance with another embodiment, a MEMS device includes a first movable electrode structure and a second movable electrode structure spaced apart from the first movable electrode structure. The first movable electrode structure and the second movable electrode structure enclose a gap between the first movable electrode structure and the second movable electrode structure. The gap has a gas pressure lower than an ambient pressure. The MEMS device further includes a static electrode structure within the gap and interposed between the first movable electrode structure and the second movable electrode structure and a plurality of pillars extending through the gap and connecting the first movable electrode structure and the second movable electrode structure. The plurality of pillars extend through the static electrode structure. The plurality of pillars divide the gap into a plurality of gap regions. Different gap regions have different thicknesses.

In accordance with yet another embodiment, a MEMS device includes a first membrane and a second membrane spaced apart from the first membrane. The first membrane and the second membrane seal a gap between the first membrane and the second membrane. The gap has a gas pressure lower than an ambient pressure. The MEMS device further includes a counter electrode structure within the gap and between the first membrane and the second membrane. A first thickness of the gap adjacent a center of the counter electrode structure is greater than a second thickness of the gap adjacent an edge of the counter electrode structure. The MEMS device further includes a plurality of pillars within the gap and connecting the first membrane and the second membrane. The plurality of pillars extend through the counter electrode structure.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
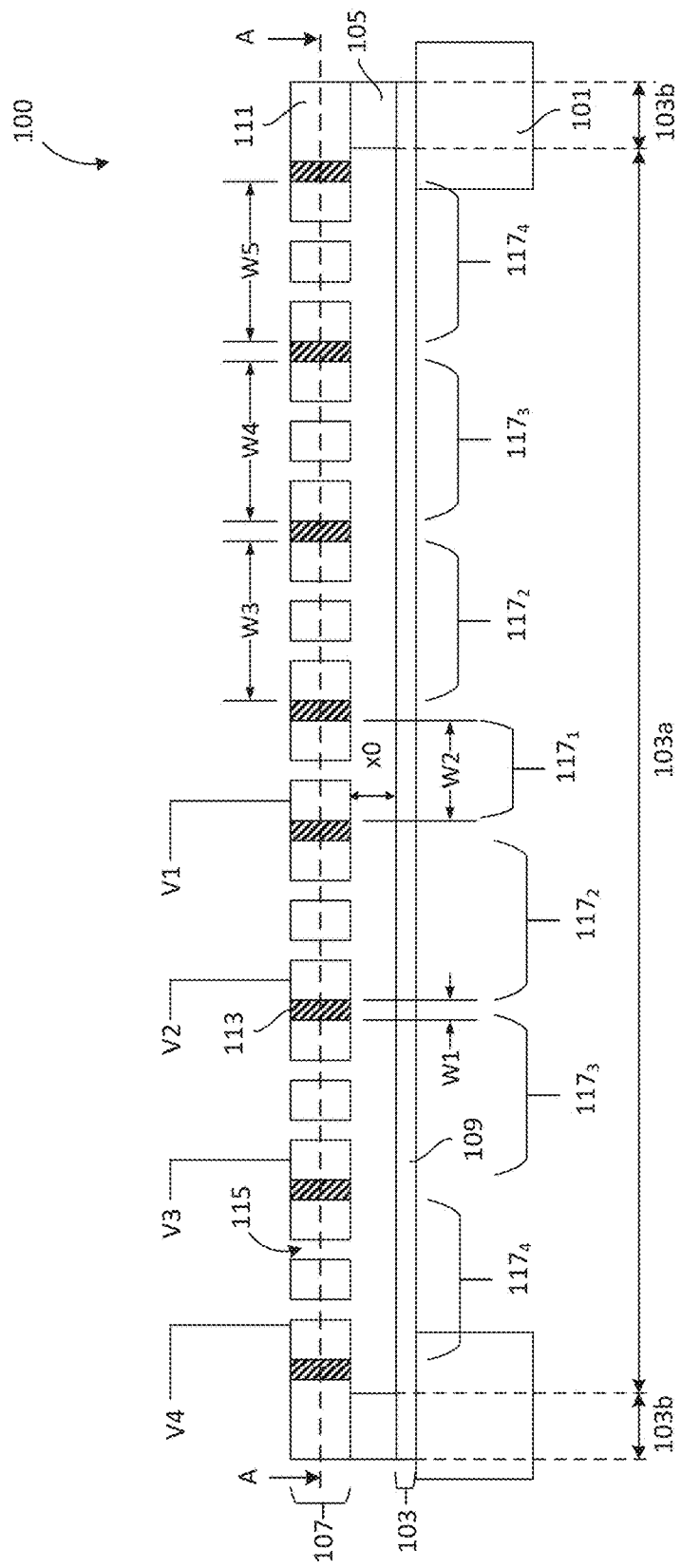
FIGS. 1A and 1B show a schematic cross-sectional view and a schematic plane view of a capacitive MEMS device in accordance with some embodiments.

Before discussing embodiments in further detail using the drawings, it is pointed out that in the figures and in the specification identical elements and elements having the same functionality and/or the same technical or physical effect, are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of specific semiconductor devices which can be capacitively read out, such as capacitive MEMS devices. The specific embodiments discussed are merely illustrative of specific ways to make and use the present concept and do not limit the scope. In the following description of embodiments, the same or similar elements having the same function have associated therewith the same reference signs or the same name, and a description for such elements will not be repeated for every embodiment. Moreover, features of the different embodiments as described herein may be combined with each other, unless specifically noted otherwise.

In the following, the present concept will be described with respect to embodiments in the context of capacitive MEMS devices in general, where the following description may also be applied to any MEMS sound transducer, such as microphones or loudspeakers having a single membrane or single backplate configuration or having a dual membrane or a dual backplate configuration, as well as to any capacitive pressure sensors, acceleration sensors, actuators, etc., which can be capacitively read out or can be capacitively activated.

In various embodiments of present disclosure, a sensitivity of a capacitive MEMS device is improved. Sensitivity S of a capacitive MEMS device comprising a static electrode, such as a backplate, and a movable electrode, such as a membrane or a diaphragm, is a combination of a mechanical sensitivity $S_{mech}$ and an electrical sensitivity $S_{el}$ and is given by the equation $S=S_{mech} \times S_{el}$, with $S_{mech} \propto C_{mech}$ and $S_{el} \propto V_{bias}/x_0$, where $C_{mech}$ is a mechanical compliance of the movable electrode, $x_0$ is a thickness of an air gap between the movable electrode and the static electrode, and $V_{bias}$ is a bias voltage across the air gap. In some embodiments, a radial non-uniformity of the mechanical compliance $C_{mech}$ of the movable electrode may be compensated by applying different bias voltages to different ring segments of a capacitive MEMS device. In other embodiments, the radial non-uniformity of the mechanical compliance $C_{mech}$ of the movable electrode may be compensated by adjusting thicknesses of air gaps of different ring segments of a capacitive MEMS device. In some embodiments, thicknesses of the air gaps of different ring segments of a capacitive MEMS device may be adjusted by adjusting thicknesses of movable electrodes of respective ring segments. In other embodiments, thicknesses of the air gaps of different ring segments of a capacitive MEMS device may be adjusted by adjusting a spacing (or pitch) of pillars separating adjacent ring segments of the capacitive MEMS device. In yet other embodiments, thicknesses of the air gaps of different ring segments of a capacitive MEMS device may be adjusted by adjusting both thicknesses of movable electrodes of respective ring segments and a spacing of pillars separating adjacent ring segments of the capacitive MEMS device. In yet other embodiments, thicknesses of the air gaps of different ring segments of a capacitive MEMS device may be adjusted by adjusting a thickness of a sacrificial layer while forming the capacitive MEMS device, such that a static electrode of the capacitive MEMS device is non-planar.

Figure 1B:
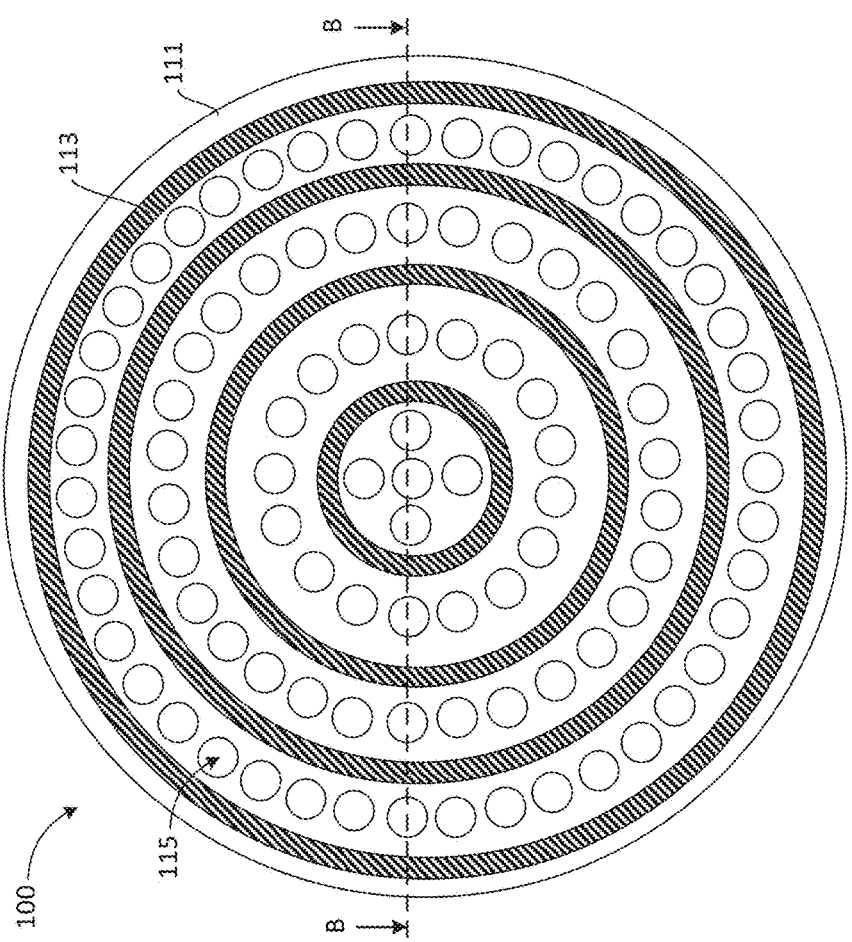

FIGS. 1A and 1B show a schematic cross-sectional view and a schematic plane view of a capacitive MEMS device 100, such as a capacitive MEMS sound transducer, in accordance with some embodiments. FIG. 1B shows a plane view of the capacitive MEMS device 100 of FIG. 1A with respect to the plane as indicated by the dashed line "AA" in FIG. 1A. The dashed line "BB" in FIG. 1B indicates the intersection plane of the cross-sectional view of FIG. 1A.

Referring to FIGS. 1A and 1B, the capacitive MEMS device 100 comprises a first electrode structure 103 (for example, a membrane or diaphragm element) comprising a first conductive layer 109, and a second electrode structure 107 (for example, a counter electrode or backplate element) comprising a second conductive layer 111, which is spaced apart from the first conductive layer 109 and at least partially opposes the first conductive layer 109. In the embodiment illustrated in FIG. 1B, a plan-view shape of the second electrode structure 107 (and the second conductive layer 111) is a circle. In other embodiments, the plan-view shape of the second electrode structure 107 (and the second conductive layer 111) may be an oval, a square, a rectangle, a polygon, or the like. In some embodiments, the first electrode structure 103 (and the first conductive layer 109) has a similar plan-view shape as the second electrode structure 107 (and the second conductive layer 111). In some embodiments, the first conductive layer 109 and the second conductive layer 111 may comprise a suitable conductive material, such as, for example, polycrystalline silicon (polysilicon).

In some embodiments, the second electrode structure 107 is a perforated structure. In such embodiments, the second conductive layer 111 of the second electrode structure 107 comprises a plurality of holes 115. In the embodiment illustrated in FIG. 1B, a plan-view shape of each of the holes 115 is a circle. In other embodiments, the plan-view shape of each of the holes 115 may be an oval, a square, a rectangle, a polygon, an irregular shape, or the like.

In some embodiments, the second electrode structure 107 comprises a plurality of segmentation structures 113, which provide an electrical isolation between various regions of the second electrode structure 107. In some embodiments, the plurality of segmentation structures 113 comprise a suitable insulating material. As shown in FIG. 1B, each of the segmentation structures 113 has an annular shape. In the embodiment illustrated in FIG. 1B, each of the segmentation structures 113 have a shape of a ring, such that the rings have a same center (or are concentric). In other embodiments, annular shapes of the segmentation structures 113 may be an oval annular shape, a square annular shape, a rectangular annular shape, a polygonal annular shape, an irregular annular shape, or the like. In yet other embodiments, the segmentation structures 113 may be non-concentric structures. In some embodiments, the segmentation structures 113 have a width W1 between about 0.2 μm and about 2 μm. In some embodiments, a ratio of the width W1 of the segmentation structures 113 over a thickness of the second electrode structure 107 is between about 0.5 and about 2. In some embodiments where the segmentation structures 113 have a ring shape, the width W1 is equal to a difference between an outer radius and an inner radius of the ring.

The segmentation structures 113 divide the capacitive MEMS device 100 into a plurality of regions $117_1$ to $117_4$. In some embodiments, the regions $117_2$ to $117_4$ have an annular shape. In some embodiments, the regions $117_2$ to $117_4$ and the segmentation structures 113 have similar annular shapes. For example, in some embodiments where the segmentation structures 113 have ring shapes, the regions $117_2$ to $117_4$ also have ring shapes. In some embodiments, the region $117_1$ has a non-annular shape. In some embodiments where the segmentation structures 113 have ring shapes, the region $117_1$ has a circular shape. In some embodiments, the region $117_1$ has a width (diameter) W2 between about 10 μm and about 100 μm. In some embodiments, the region $117_2$ has a width W3 between about 10 μm and about 100 μm. In some embodiments, the region $117_3$ has a width W4 between about 10 μm and about 100 μm. In some embodiments, the region $117_4$ has a width W5 between about 10 μm and about 100 μm. In some embodiments, the widths W3, W4 and W5 are equal to each other. In alternative embodiments, the width W3, W4 and W5 may be different from each other. In the embodiment illustrated in FIGS. 1A and 1B, the second electrode structure 107 comprises four segmentation structures that electrically isolate four regions of the second electrode structure 107. In alternative embodiments, the number of segmentation structures and electrically isolated regions of the second electrode structure 107 may vary according to design specifications of the capacitive MEMS device 100.

Referring further to FIG. 1A, the capacitive MEMS device 100 further includes a spacer or a supporting element 105 between the first electrode structure 103 and the second electrode structure 107 in a peripheral (anchoring) area, for holding the first electrode structure 103 and the second electrode structure 107 in a predefined distance $x_0$ from each other. In such embodiments, the air gap between the first electrode structure 103 and the second electrode structure 107 has a thickness $x_0$. In some embodiments, the distance (thickness) $x_0$ is between about 1 μm and about 10 μm. As it is further shown in FIG. 1A, the first electrode structure 103 comprises a displaceable (movable) portion 103a and a fixed portion 103b, where the fixed portion 103b of the first electrode structure is, for example, mechanically connected to the spacer element 105. Moreover, the second electrode structure 107 is, for example, also fixed to the spacer element 105. In the following description, the terms deflectable, displaceable and movable are interchangeable terms. The same applies to the terms deflection and displacement, for example.

In some embodiments, the capacitive MEMS device 100 further includes a supporting structure 101, which supports the first electrode structure 103, the second electrode structure 107, and the supporting element 105. In some embodiments, the supporting structure 101 may be formed from a silicon substrate. In other embodiments, the supporting structure 101 may be formed using any suitable material having acceptable mechanical properties.

Referring further to FIG. 1A, the regions $117_2$ to $117_4$ of the capacitive MEMS device 100 are biased to compensate a radial non-uniformity of a mechanical compliance of the first electrode structure 103. In some embodiments, the region $117_1$ is biased by a voltage V1, the region $117_2$ is biased by a voltage V2, the region $117_3$ is biased by a voltage V3, and the region $117_4$ is biased by a voltage V4. In some embodiments, the voltage V2 is greater than the voltage V1, the voltage V3 is greater than the voltage V2, and the voltage V4 is greater than the voltage V3. In some embodiments, the voltage V1 is between about 5 V and about 10 V. In some embodiments, the voltage V2 is between about 7 V and about 12 V. In some embodiments, the voltage V3 is between about 10 V and about 15 V. In some embodiments, the voltage V4 is between about 15 V and about 20 V. In some embodiments, the regions $117_2$ to $117_4$ may be biased such that each of the regions $117_2$ to $117_4$ may provide substantially similar contributions to the sensitivity S of the capacitive MEMS device 100.

Figure 2:
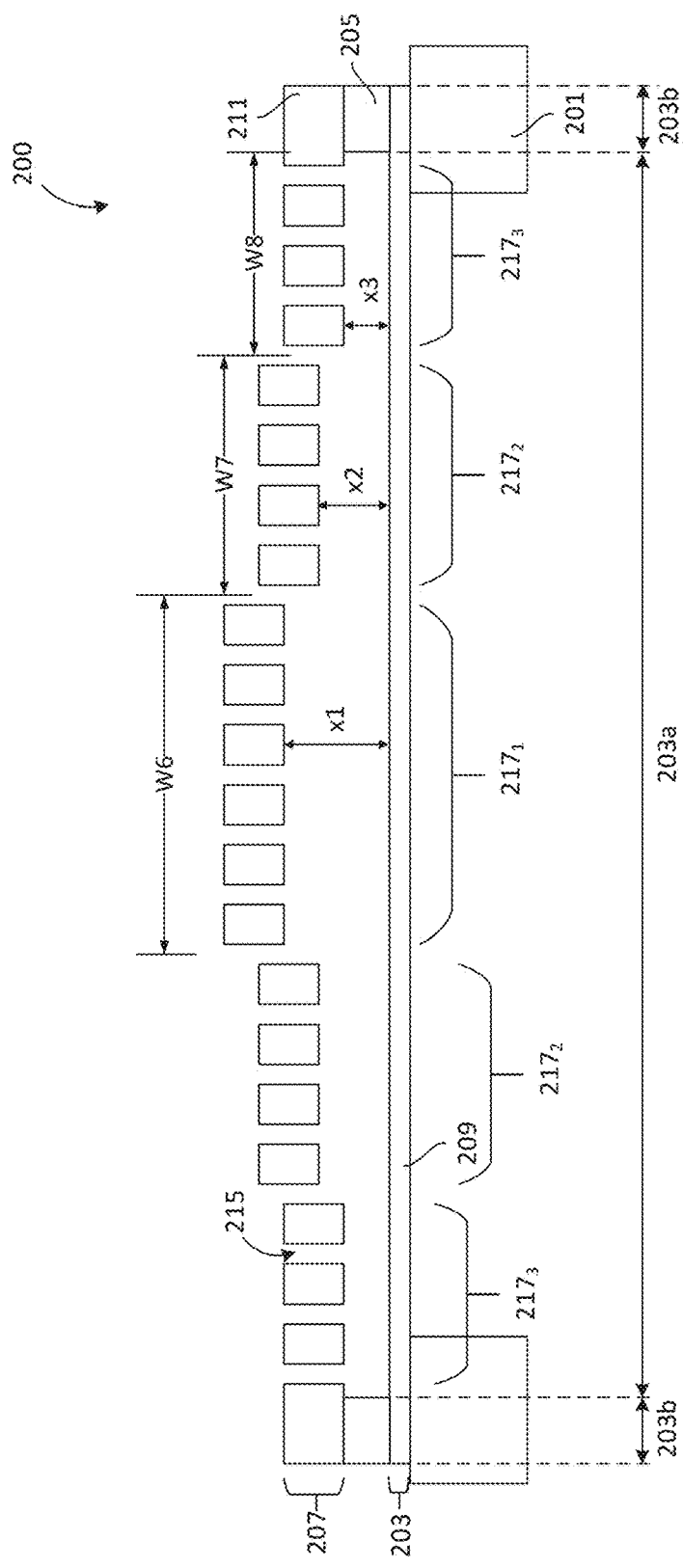
FIG. 2 shows a schematic cross-sectional view of a capacitive MEMS device in accordance with some embodiments.

FIG. 2 shows a schematic cross-sectional view of a capacitive MEMS device 200 in accordance with some embodiments. Elements labeled using numerical references 2xx in FIG. 2 are similar to elements labeled using numerical references 1xx in FIGS. 1A and 1B and the detailed description is not repeated herein. In some embodiments, the capacitive MEMS device 200 comprises a first electrode structure 203 (for example, a membrane or diaphragm element) comprising a first conductive layer 209, and a second electrode structure 207 (for example, a counter electrode or backplate element) comprising a second conductive layer 211, which is spaced apart from the first conductive layer 209 and at least partially opposes the first conductive layer 209. In some embodiments, plan-view shapes of the first electrode structure 203 and the second electrode structure 207 are circles. In other embodiments, the plan-view shapes of the first electrode structure 203 and the second electrode structure 207 may be ovals, squares, rectangles, polygons, or the like.

In some embodiments, the second electrode structure 207 is a perforated structure. In such embodiments, the second conductive layer 211 of the second electrode structure 207 comprises a plurality of holes 215. In some embodiments, a plan-view shape of each of the holes 215 is a circle. In other embodiments, the plan-view shape of each of the holes 215 may be an oval, a square, a rectangle, a polygon, an irregular shape, or the like.

In some embodiments, the capacitive MEMS device 200 further includes a spacer or a supporting element 205 between the first electrode structure 203 and the second electrode structure 207 in a peripheral (anchoring) area, for holding the first electrode structure 203 and the second electrode structure 207 in a predefined distance from each other. As it is further shown in FIG. 2, the first electrode structure 203 comprises a displaceable (movable) portion 203a and a fixed portion 203b, where the fixed portion 204b of the first electrode structure 203 is, for example, mechanically connected to the spacer 205. Moreover, the second electrode structure 207 is, for example, also fixed to the spacer 205. In some embodiments, the capacitive MEMS device 200 further includes a supporting structure 201, which supports the first electrode structure 203, the second electrode structure 207, and the supporting element 105.

Referring further to FIG. 2, a radial non-uniformity of a mechanical compliance of the first electrode structure 203 may be compensated by adjusting a thickness of an air gap between the first electrode structure 203 and the second electrode structure 207. In the embodiment illustrated in FIG. 2, the air gap between the first electrode structure 203 and the second electrode structure 207 has a non-uniform thickness. In the illustrated embodiment, the second conductive layer 211 of the second electrode structure 207 is a non-planar layer, such that different regions of the of the second electrode structure 207 are spaced apart from the first electrode structure 203 by different distances. In some embodiments, the non-planar second conductive layer 211 may formed on a sacrificial layer having a non-uniform thickness. In some embodiments, the capacitive MEMS device 200 comprises a plurality of regions $217_1$ to $217_3$. In some embodiments, an air gap between the second electrode structure 207 and the first electrode structure 203 within the region $217_1$ of has a thickness x1, an air gap between the second electrode structure 207 and the first electrode structure 203 within the region $217_2$ of has a thickness x2, and an air gap between the second electrode structure 207 and the first electrode structure 203 within the region $217_3$ of has a thickness x3. In some embodiments, the thickness x1 is greater than the thickness x2, and the thickness x2 is greater than the thickness x3. In some embodiments, the thickness x1 is between about 2 μm and about 3 μm. In some embodiments, the thickness x2 is between about 1.5 μm and about 2.5 μm. In some embodiments, the thickness x3 is between about 1 μm and about 2 μm.

In some embodiments, the regions $217_2$ and $217_3$ have annular shapes. In some embodiments, the region $217_1$ has a non-annular shape. In some embodiments, each of the regions $217_2$ and $217_3$ has a plan-view shape of a ring. In other embodiments, a plan-view shape of each of the regions $217_2$ and $217_3$ may be an oval annular shape, a square annular shape, a rectangular annular shape, a polygonal annular shape, or the like. In some embodiments, a plan-view shape of the region $217_1$ may be similar to a plan-view shape of the region $217_2$. For example, in some embodiment where the plan-view shape of the region $217_2$ is a ring, the plan-view shape of the region $217_1$ is a circle. In some embodiments, the region $217_1$ has a width W6 between about 300 μm and about 600 μm. In some embodiments, the region $217_2$ has a width W7 between about 200 μm and about 400 μm. In some embodiments, the region $217_3$ has a width W8 between about 100 μm and about 300 μm. In some embodiments, the widths W6, W7, and W8 may be equal to each other. In alternative embodiments, the widths W6, W7, and W8 may be different from each other.

Figure 3:
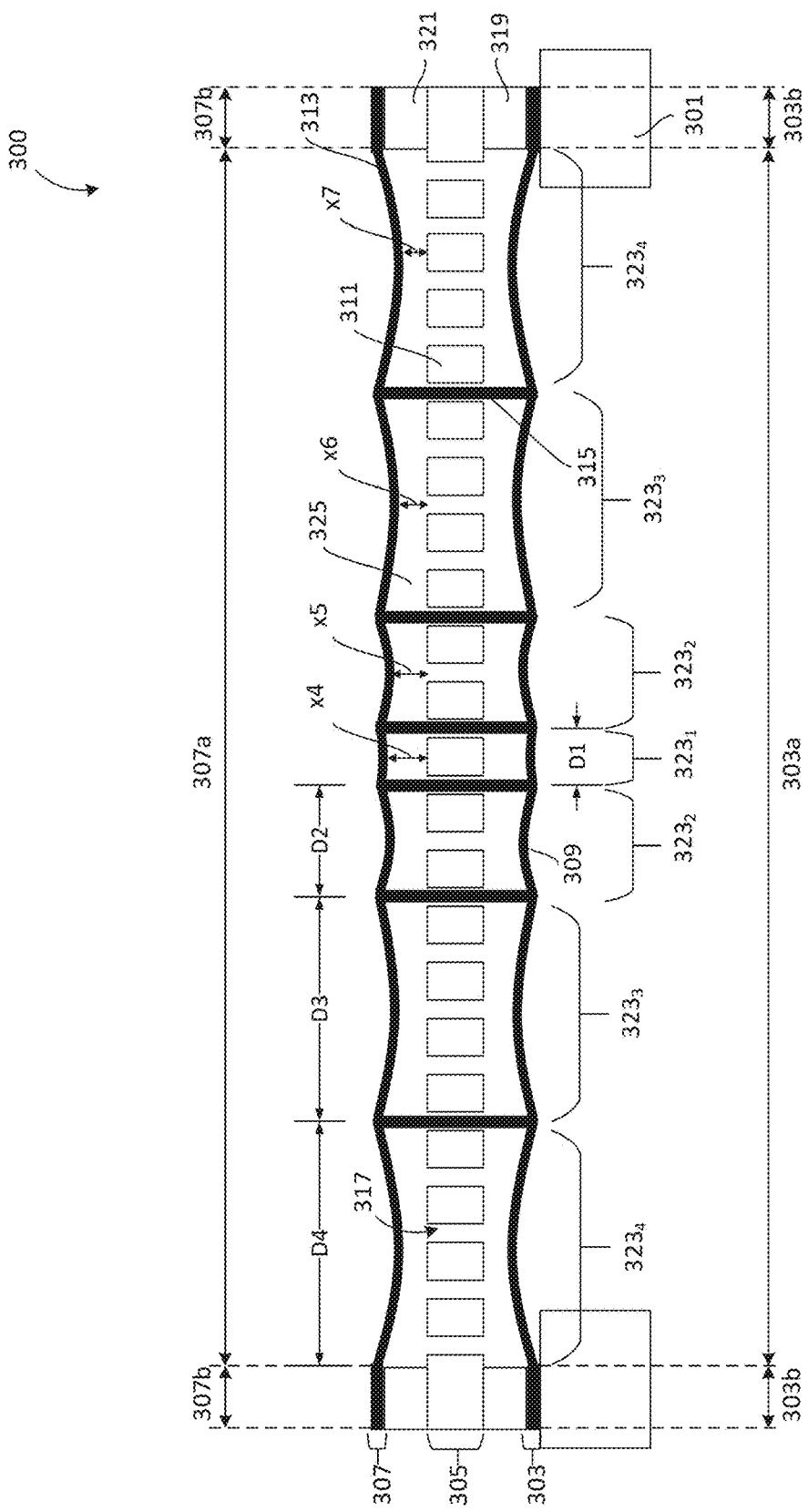
FIG. 3 shows a schematic cross-sectional view of a capacitive MEMS device in accordance with some embodiments.

FIG. 3 shows a schematic cross-sectional view of a capacitive MEMS device 300 in accordance with some embodiments. In some embodiments, the capacitive MEMS device 300 is a vacuum MEMS microphone, which comprises a first electrode structure 303 (for example, a first membrane or diaphragm element) and a second electrode structure 307 (for example, a second membrane or diaphragm element), which is spaced apart from the first electrode structure 303. A low pressure region 325, such as a vacuum region or near-vacuum region is located between the first electrode structure 303 and the second electrode structure 307, where the low pressure region 325 has a (gas) pressure less than an ambient pressure. The capacitive MEMS device 300 further includes a third electrode structure 305 (for example, a counter electrode or backplate element), which is at least partially arranged in the low pressure region 325 or extends in the low pressure region 325.

The first electrode structure 303 comprises a first conductive layer 309. In some embodiments, the first conductive layer 309 may comprise similar materials as the first conductive layer 109 described above with reference to FIG. 1A and the description is not repeated herein. The second electrode structure 307 comprises a second conductive layer 313. In some embodiments, the second conductive layer 313 may comprise similar materials as the first conductive layer 109 described above with reference to FIG. 1A and the description is not repeated herein. The third electrode structure 305 comprises a third conductive layer 311. In some embodiments, the third conductive layer 311 may comprise similar materials as the second conductive layer 111 described above with reference to FIG. 1A and the description is not repeated herein.

In some embodiments, the third electrode structure 305 is a perforated structure. In such embodiments, the third conductive layer 311 of the third electrode structure 305 comprises a plurality of holes 317. In some embodiments, the third electrode structure 305 may have a similar plan-view structure/shape as the second electrode structure 107 illustrated in FIG. 1B and the description is not repeated herein. In some embodiments, the first electrode structure 303 and the second electrode structure 307 may have similar plan-view shapes as the third electrode structure 305.

Referring further to FIG. 3, spacers 319 and 321 may be arranged between the first electrode structure 303 and the third electrode structure 305 and between the second electrode structure 307 and the third electrode structure 305, respectively, for holding the first electrode structure 303 and the second electrode structure 307 in a predefined distance from the third electrode structure 305. In some embodiments, the first electrode structure 303 comprises a displaceable (movable) portion 303a and a fixed portion 303b, and the second electrode structure 307 comprises a displaceable (movable) portion 307a and a fixed portion 307b. The fixed portion 303b of the first electrode structure 303 is, for example, mechanically connected (attached) to the first spacer 319 and the fixed portion 307b of the second electrode structure 307 is mechanically connected (attached) to the second spacer 321. Moreover, the third electrode structure 305 is, for example, fixed (sandwiched) between the first spacer 319 and the second spacer 321.

As also shown in FIG. 3, one or more pillars (columns or struts) 315 are mechanically coupling the first electrode structure 303 and the second electrode structure 307. To be more specific, at least one pillar 315 is mechanically coupled between the displaceable portion 303a of the first electrode structure 303 and the displaceable portion 307a of the second electrode structure 307. In some embodiments where the pillars 315 are electrically conductive, the pillars 315 provide a mechanical and electrical coupling between the first electrode structure 303 and the second electrode structure 307. In some embodiments where the pillars 315 are electrically insulating, the one or more pillars 315 provide a mechanical coupling and electrical decoupling between the first electrode structure 303 and the second electrode structure 307.

The pillars 315 typically do not contact or touch the third electrode structure 305, but rather may pass through the third electrode structure 305. In some embodiments, the pillars may pass through via openings or holes 317 in the third conductive layer 311. In the embodiment illustrated in FIG. 3, the pillars 315 may be integrally formed with the first electrode structure 303 and the second electrode structure 307. Hence, the first electrode structure 303, the second electrode structure 307, and the pillars 315 may form an integral structure of the same material, for example, polycrystalline silicon (poly-silicon). Nevertheless, this does not mean that the first electrode structure 303, the second electrode structure 307, and the pillars 315 need to be formed concurrently during manufacture of the capacitive MEMS device 300. Rather, it may be possible that the first electrode structure 303 may be formed first on a surface of a substrate 301 (or on a surface of an auxiliary layer such as an etch stop layer) during a (first) deposition process. Subsequently, the pillars 315 and eventually the second electrode structure 307 may be formed during a subsequent (second) deposition process and possibly during a further subsequent (third) deposition process. In alternative embodiments, the pillars 315 may be of a different material than the first electrode structure 303 and the second electrode structure 307.

Referring further to FIG. 3, the pillars 315 may divide the capacitive MEMS device 300 into a plurality of concentric regions $323_1$ to $323_4$. In some embodiments, each of the regions $323_3$ to $323_4$ has a plan-view shape of a ring. In other embodiments, a plan-view shape of each of the regions $323_1$ to $323_4$ may be an oval annular shape, a square annular shape, a rectangular annular shape, a polygonal annular shape, an irregular annular shape, or the like. In yet other embodiments, the regions $323_1$ to $323_4$ may be non-concentric regions. In some embodiments, a plan-view shape of the region $323_1$ may be similar to a plan-view shape of the region $323_2$. For example, in some embodiment where the plan-view shape of the region $323_2$ is a ring, the plan-view shape of the region $323_1$ is a circle.

In some embodiments, a radial non-uniformity of a mechanical compliance of the first electrode structure 303 and the second electrode structure 307 may be compensated by adjusting a thickness of an air gap between the first electrode structure 303 and the third electrode structure 305, and a thickness of an air gap between the second electrode structure 307 and the third electrode structure 305. In some embodiments, the thicknesses of the air gaps may be adjusted by adjusting the spacing (or the pitch) between adjacent pillars 315, or equivalently, adjusting widths of the regions $323_1$ to $323_4$ of the capacitive MEMS device 300. In the embodiment illustrated in FIG. 3, the spacing of the pillars 315 (or the width of the regions $323_1$ to $323_4$) increases from a center of the capacitive MEMS device 300 to a periphery of the capacitive MEMS device 300, which causes the thicknesses of the air gaps to decrease from the center of the capacitive MEMS device 300 to the periphery of the capacitive MEMS device 300.

In some embodiments, the region $323_1$ has a width D1 (which is equal to the spacing between the pillars 315 defining the region $323_1$) and a thickness x4 of a respective air gap, the region $323_2$ has a width D2 (which is equal to the spacing between the pillars 315 defining the region $323_2$) and a thickness x5 of a respective air gap, the region $323_3$ has a width D3 (which is equal to the spacing between the pillars 315 defining the region $323_3$) and a thickness x6 of a respective air gap, and the region $323_4$ has a width D4 (which is equal to the spacing between the pillar 315 and the spacers 319 and 321 defining the region $323_4$) and a thickness x7 of a respective air gap. In the embodiment illustrated in FIG. 3, the width D4 is greater than the width D3, the width D3 is greater than the width D2, and the width D2 is greater than the width D1, which causes the thickness x4 to be greater than the thickness x5, the thickness x5 to be greater than the thickness x6, and the thickness x6 to be greater than the thickness x7.

In some embodiments, the width D1 is between about 10 µm and about 20 µm. In some embodiments, the width D2 is between about 30 µm and about 20 µm. In some embodiments, the width D3 is between about 40 µm and about 30 µm. In some embodiments, the width D4 is between about 50 µm and about 40 µm. In some embodiments, the thickness x4 between about 2.00 µm and about 1.97 µm. In some embodiments, the thickness x5 is between about 1.97 µm and about 1.86 µm. In some embodiments, the thickness x6 is between about 1.86 µm and about 1.57 µm. In some embodiments, the thickness x7 is between about 1.57 µm and about 1.00 µm.

In some embodiments, by adjusting the spacing between adjacent pillars 315, the maximum deflection (bending) of a portion of the first electrode structure 303 (or the second electrode structure 307) supported by the adjacent pillars 315 may be also adjusted. In an embodiment where the thickness of the first electrode structure 303 (or the second electrode structure 307) is about 500 nm and the spacing between the adjacent pillars 315 is about 10 µm, the maximum deflection is about 2 nm. In an embodiment where the thickness of the first electrode structure 303 (or the second electrode structure 307) is about 500 nm and the spacing between the adjacent pillars 315 is about 20 µm, the maximum deflection is about 27 nm. In an embodiment where the thickness of the first electrode structure 303 (or the second electrode structure 307) is about 500 nm and the spacing between the adjacent pillars 315 is about 30 µm, the maximum deflection is about 135 nm. In an embodiment where the thickness of the first electrode structure 303 (or the second electrode structure 307) is about 500 nm and the spacing between the adjacent pillars 315 is about 40 µm, the maximum deflection is about 427 nm. In an embodiment where the thickness of the first electrode structure 303 (or the second electrode structure 307) is about 500 nm and the spacing between the adjacent pillars 315 is about 50 µm, the maximum deflection is about 1 µm.

In some embodiments, by adjusting the thickness of the air gap of the capacitive MEMS device 300 as described with reference to FIG. 3, the sensitivity and the active capacitance of the capacitive MEMS device 300 may be increased. In some embodiments, the sensitivity of the capacitive MEMS device 300 may be increased by about 0.8 dB to about 1.0 dB. In some embodiments, the active capacitance of the capacitive MEMS device 300 may be increased by about 2.0 dB to about 2.5 dB.

Figure 4:
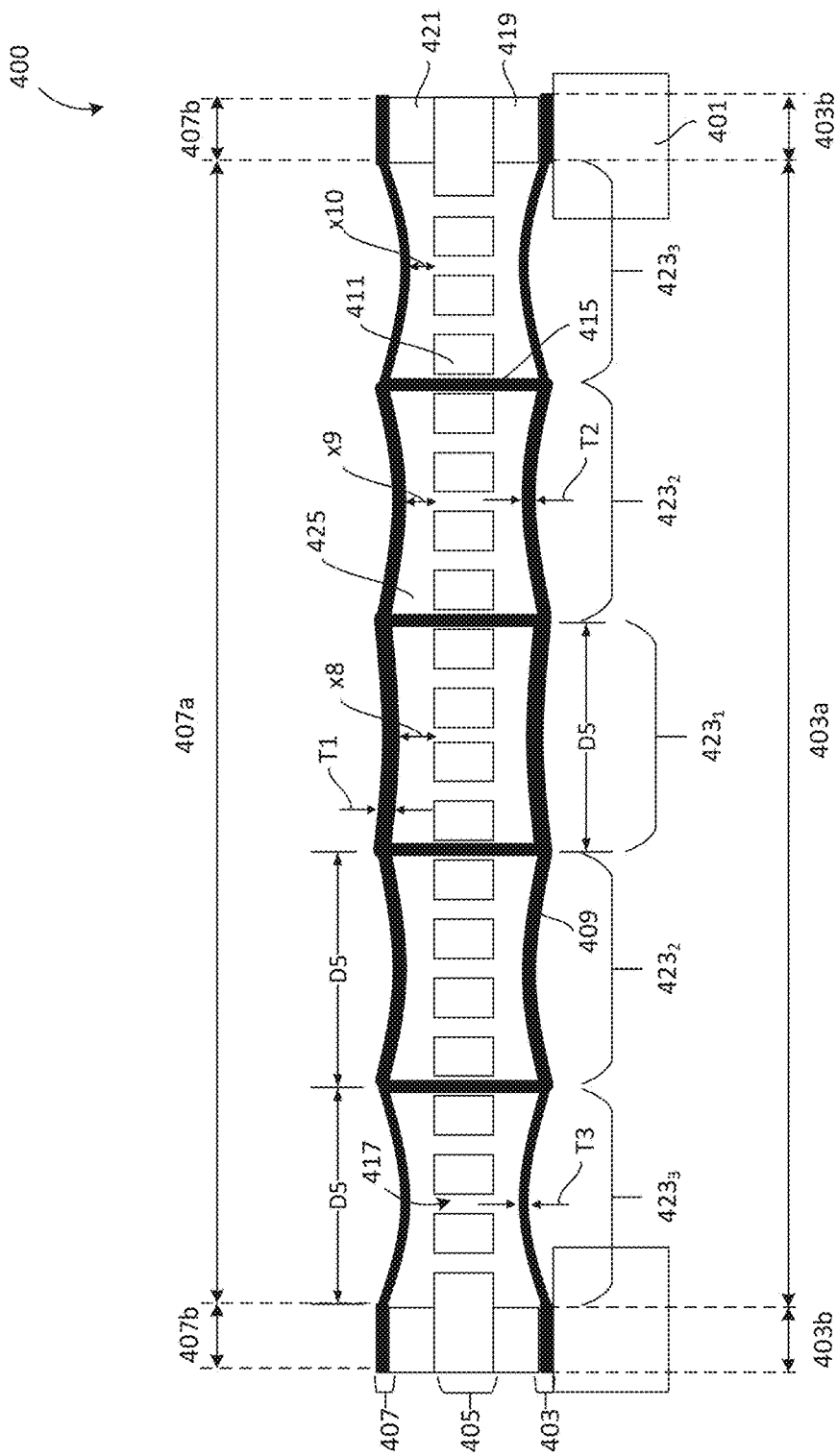
FIG. 4 shows a schematic cross-sectional view of a capacitive MEMS device in accordance with some embodiments.

FIG. 4 shows a schematic cross-sectional view of a capacitive MEMS device 400 in accordance with some embodiments. Elements labeled using numerical references 4xx in FIG. 4 are similar to elements labeled using numerical references 3xx in FIG. 3 and the detailed description is not repeated herein. In some embodiments, a radial non-uniformity of a mechanical compliance of the first electrode structure 403 and the second electrode structure 407 may be compensated by adjusting a thickness of an air gap between the first electrode structure 403 and the third electrode structure 405, and a thickness of an air gap between the second electrode structure 407 and the third electrode structure 405. In some embodiments, the thicknesses of the air gaps may be adjusted by adjusting a thickness of the first electrode structure 403 and a thickness of the second electrode structure 407 within each of the regions $423_1$-$423_3$ of the capacitive MEMS device 400, while keeping the spacing between adjacent pillars 415 or widths of the regions $423_1$-$423_3$ of the capacitive MEMS device 400 uniform (constant). In the embodiment illustrated in FIG. 4, the thickness of the first electrode structure 403 and the thickness of the second electrode structure 407 decrease from a center of the capacitive MEMS device 400 to a periphery of the capacitive MEMS device 400, which causes the thicknesses of the air gaps to decrease from the center of the capacitive MEMS device 400 to the periphery of the capacitive MEMS device 400. In some embodiments, a spacing $D_5$ between each pair of adjacent pillars 415 is between about 20 µm and about 40 µm.

In some embodiments, the first electrode structure 403 and the second electrode structure 407 have a thickness T1 within the region $423_1$, the first electrode structure 403 and the second electrode structure 407 have a thickness T2 within the region $423_2$, and the first electrode structure 403 and the second electrode structure 407 have a thickness T3 within the region $423_2$. In some embodiments, the region $423_1$ has a thickness x8 of a respective air gap, the region $423_2$ has a thickness x9 of a respective air gap, and the region $423_3$ has a thickness x10 of a respective air gap. In the embodiment illustrated in FIG. 4, the thickness T1 is greater than the thickness T2, and the thickness T2 is greater than the thickness T3, which causes the thickness x8 to be greater than the thickness x9, and the thickness x9 to be greater than the thickness x10.

In some embodiments, the thickness T1 is between about 400 nm and about 600 nm. In some embodiments, the thickness T2 is between about 200 nm and about 300 nm. In some embodiments, the thickness T3 is between about 150 nm and about 200 nm. In some embodiments, the thickness x8 is between about 2 μm and about 1.9 μm. In some embodiments, the thickness x9 is between about 1.8 μm and about 1.6 μm. In some embodiments, the thickness x10 is between about 1.6 μm and about 1.0 μm.

In some embodiments, by adjusting the thickness of the first electrode structure 403 and the thickness of the second electrode structure 407 within each of the regions $423_1$-$423_3$ of the capacitive MEMS device 400, the maximum deflection (bending) of a portion of the first electrode structure 403 (or the second electrode structure 407) within each of the regions $423_1$-$423_3$ of the capacitive MEMS device 400 may be also adjusted. In an embodiment where the spacing between the adjacent pillars 415 is about 20 μm and the thickness of the first electrode structure 403 (or the second electrode structure 407) is about 100 nm, the maximum deflection is about 3333 nm. In an embodiment where the spacing between the adjacent pillars 415 is about 20 μm and the thickness of the first electrode structure 403 (or the second electrode structure 407) is about 200 nm, the maximum deflection is about 417 nm. In an embodiment where the spacing between the adjacent pillars 415 is about 20 μm and the thickness of the first electrode structure 403 (or the second electrode structure 407) is about 300 nm, the maximum deflection is about 124 nm. In an embodiment where the spacing between the adjacent pillars 415 is about 20 μm and the thickness of the first electrode structure 403 (or the second electrode structure 407) is about 400 nm, the maximum deflection is about 52 nm. In an embodiment where the spacing between the adjacent pillars 415 is about 20 μm and the thickness of the first electrode structure 403 (or the second electrode structure 407) is about 500 nm, the maximum deflection is about 27 nm. In an embodiment where the spacing between the adjacent pillars 415 is about 20 μm and the thickness of the first electrode structure 403 (or the second electrode structure 407) is about 600 nm, the maximum deflection is about 15 nm. In an embodiment where the spacing between the adjacent pillars 415 is about 20 μm and the thickness of the first electrode structure 403 (or the second electrode structure 407) is about 700 nm, the maximum deflection is about 10 nm. In an embodiment where the spacing between the adjacent pillars 415 is about 20 μm and the thickness of the first electrode structure 403 (or the second electrode structure 407) is about 800 nm, the maximum deflection is about 6.5 nm. In an embodiment where the spacing between the adjacent pillars 415 is about 20 μm and the thickness of the first electrode structure 403 (or the second electrode structure 407) is about 900 nm, the maximum deflection is about 4.6 nm.

Figure 5:
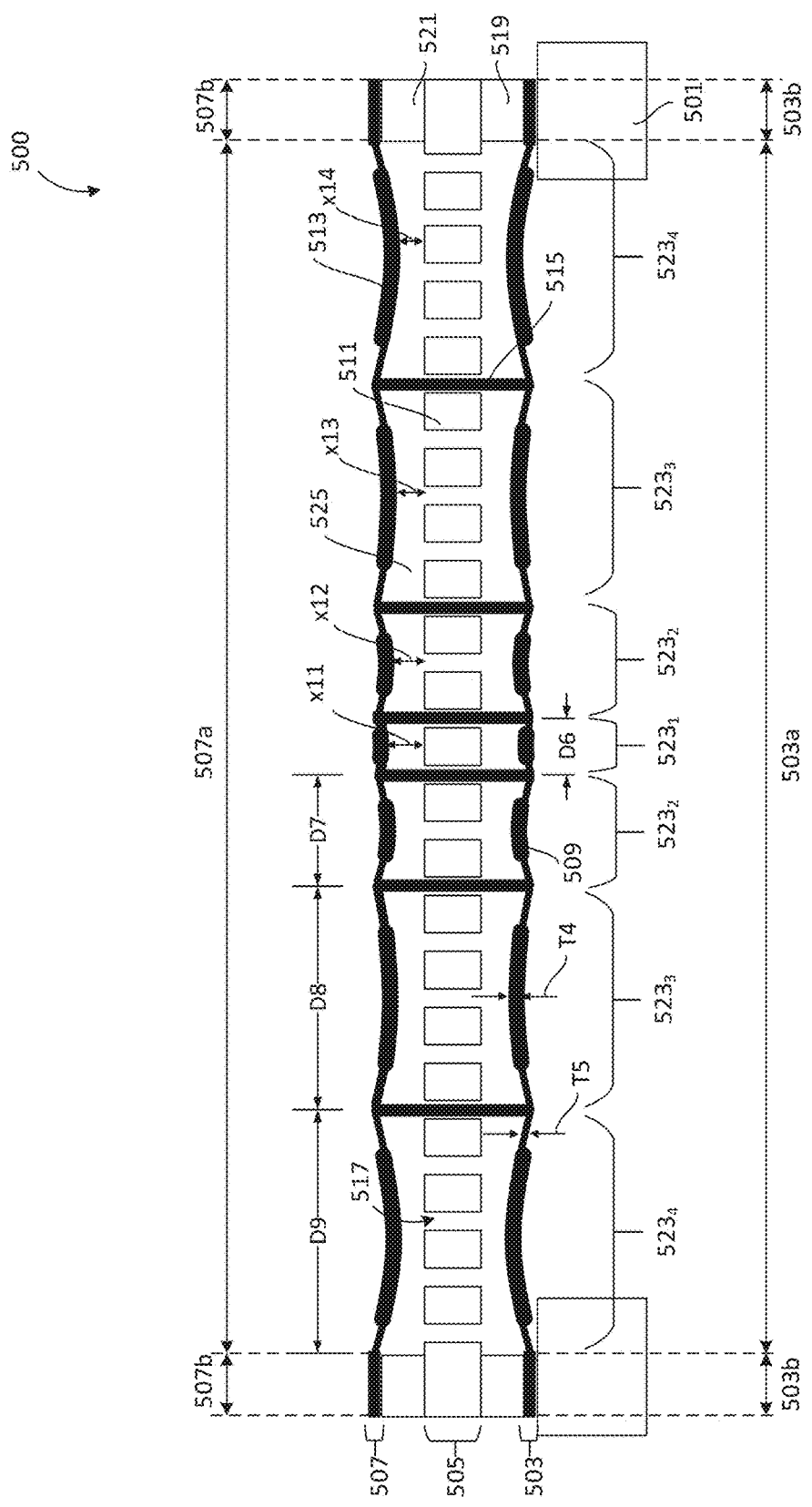
FIG. 5 shows a schematic cross-sectional view of a capacitive MEMS device in accordance with some embodiments.

FIG. 5 shows a schematic cross-sectional view of a capacitive MEMS device 500 in accordance with some embodiments. Elements labeled using numerical references 5xx in FIG. 5 are similar to elements labeled using numerical references 3xx in FIG. 3 and the detailed description is not repeated herein. In some embodiments, a radial non-uniformity of a mechanical compliance of the first electrode structure 503 and the second electrode structure 507 may be compensated by adjusting a thickness of an air gap between the first electrode structure 503 and the third electrode structure 505, and a thickness of an air gap between the second electrode structure 507 and the third electrode structure 505. In the embodiment illustrated in FIG. 5, the spacing of the pillars 515 (or the width of the regions $523_1$ to $523_4$ of the capacitive MEMS device 500) increases from a center of the capacitive MEMS device 500 to a periphery of the capacitive MEMS device 500, which causes the thicknesses of the air gaps to decrease from the center of the capacitive MEMS device 500 to the periphery of the capacitive MEMS device 500. In some embodiments, the thicknesses of the air gaps may be further adjusted by adjusting thicknesses of the first electrode structure 503 and the second electrode structure 507 within each of the regions $523_1$ to $523_4$ of the capacitive MEMS device 500, such the first electrode structure 503 and the second electrode structure 507 have a non-uniform thicknesses within each of the regions $523_1$ to $523_4$. In some embodiments, within each of the regions $523_1$ to $523_4$, interior portions of the first electrode structure 503 and the second electrode structure 507 have a thickness T4, and peripheral portions (interposed between the interior regions and respective pillars 515) of the first electrode structure 503 and the second electrode structure 507 have a thickness T5, such that the thickness T4 is different from the thickness T5. In some embodiments, the thickness T4 is greater than the thickness T5. By adjusting the thickness T4 to be greater than the thickness T5, portions of the first electrode structure 503 and the second electrode structure 507 within the regions $523_1$ to $523_4$ behave closer to an ideal system, which moves like a piston. Therefore, the sensitivity of the capacitive MEMS device 500 may be further improved. In some embodiments, the thickness T4 is between about 0.5 μm and about 2 μm. In some embodiments, the thickness T5 is between about 0.15 μm and about 0.5 μm.

In some embodiments, the region $523_1$ has a width D6 (which is equal to the spacing between the pillars 515 defining the region $523_1$) and a thickness x11 of a respective air gap, the region $523_2$ has a width D7 (which is equal to the spacing between the pillars 515 defining the region $523_2$) and a thickness x12 of a respective air gap, the region $523_3$ has a width D8 (which is equal to the spacing between the pillars 515 defining the region $523_3$) and a thickness x13 of a respective air gap, and the region $523_4$ has a width D9 (which is equal to the spacing between the pillar 515 and spacers 519 and 521 defining the region $523_4$) and a thickness x14 of a respective air gap. In the embodiment illustrated in FIG. 5, the width D9 is greater than the width D8, the width D8 is greater than the width D7, and the width D7 is greater than the width D6, which causes the thickness x11 to be greater than the thickness x12, the thickness x12 to be greater than the thickness x13, and the thickness x13 to be greater than the thickness x14.

In some embodiments, the width D6 is between about 10 μm and about 30 μm. In some embodiments, the width D7 is between about 20 μm and about 40 μm. In some embodiments, the width D8 is between about 30 μm and about 50 μm. In some embodiments, the width D9 is between about 40 μm and about 60 μm. In some embodiments, the thickness x11 is between about 2 μm and about 1.97 μm. In some embodiments, the thickness x12 is between about 1.97 μm and about 1.86 μm. In some embodiments, the thickness x13 is between about 1.86 μm and about 1.57 μm. In some embodiments, the thickness x14 is between about 1.57 μm and about 1.00 μm.

In some embodiments, by adjusting the thickness of the air gap of the capacitive MEMS device 500 as described with reference to FIG. 5, the sensitivity and the active capacitance of the capacitive MEMS device 500 may be increased. In some embodiments, the sensitivity of the capacitive MEMS device 500 may be increased by about 1.4 dB to about 1.7 dB. In some embodiments, the active capacitance of the capacitive MEMS device 500 may be increased by about 4.8 dB to about 5.3 dB.

Figure 6A:
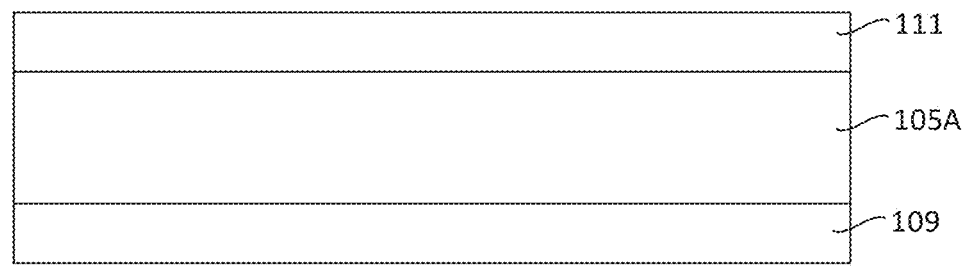
FIGS. 6A through 6F show schematic cross-sections of various stages or steps of a manufacturing process of a capacitive MEMS device in accordance with some embodiments.

FIGS. 6A through 6F show schematic cross-sections of various stages or steps of a manufacturing process of a capacitive MEMS device 100 (illustrated in FIGS. 1A and 1B) in accordance with some embodiments. Referring first to FIG. 6A, a first conductive layer 109, a second conductive layer 111 and a support layer 105A interposed between the first conductive layer 109 and the second conductive layer 111 are provided in a stacked configuration. The support layer 105A may also be referred to as a sacrificial layer 105A. In some embodiments, the first conductive layer 109 may comprise polycrystalline silicon (poly-silicon) and may have a thickness between about 200 nm and about 500 nm. In some embodiments, the support layer 105A may comprise an oxide material and may have a thickness between about 1 μm and about 3 μm. In some embodiments, the second conductive layer 111 may comprise polycrystalline silicon (poly-silicon) and may have a thickness between about 500 nm and about 1.5 μm.

Figure 6B:
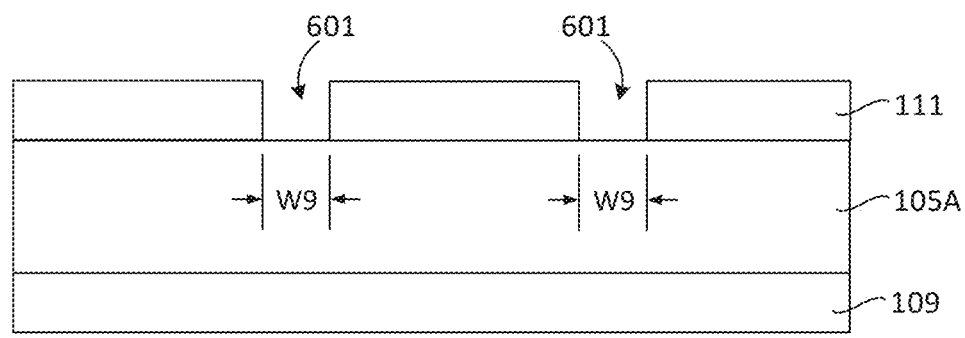

Referring to FIG. 6B, the second conductive layer 111 is patterned to form a plurality of openings 601 in the second conductive layer 111. As described below in greater detail, segmentation structures (such as the segmentation structures 113 illustrated in FIGS. 1A and 1B) will be formed in the openings 601. Accordingly, the openings 601 may also be referred to as segmentation grooves 601. In some embodiments, the second conductive layer 111 may be patterned using suitable photolithography and etching methods. In some embodiments, the patterning process may include a wet etching process, a dry etching process, or a combination thereof. In some embodiments, the openings 601 may have a width W9 between about 0.2 μm and about 1 μm.

Figure 6C:
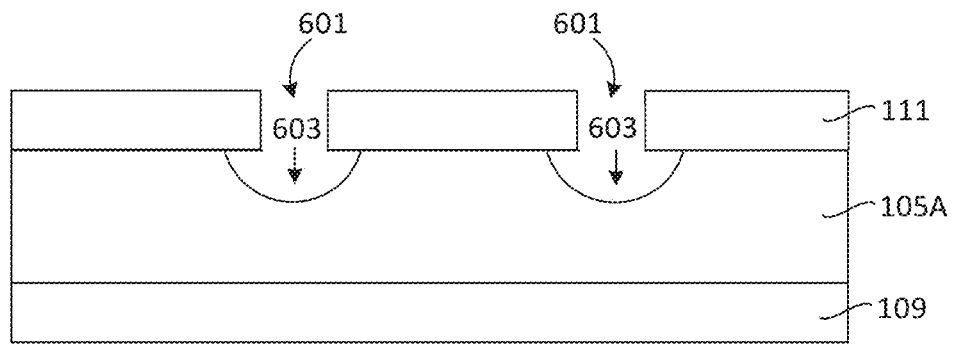

Referring to FIG. 6C, in some embodiments, the support layer 105A may be over etched during patterning the second conductive layer 111. The over-etching process forms (rivet head shaped) voids 603 in the support layer 105A, such that the voids 603 in the support layer 105A are below respective openings 601 in the second conductive layer 111.

Figure 6D:
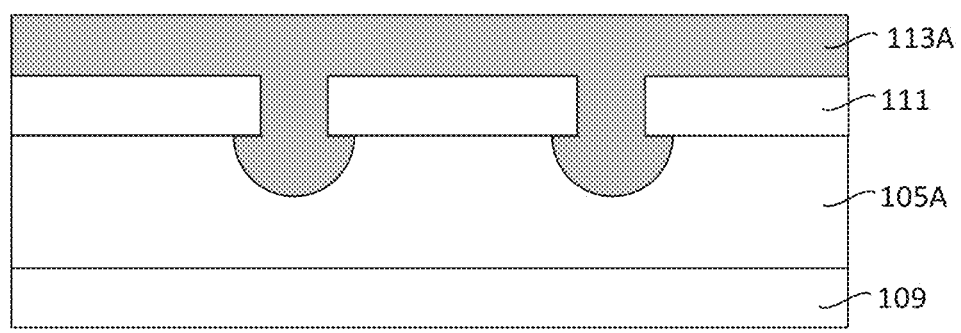

Referring to FIG. 6D, an insulating layer 113A is deposited onto the second conductive layer 111 and into the openings 601 in the second conductive layer 111. In some embodiments, insulating layer 113A may comprise a dielectric material, such as silicon nitride (Si$_3$N$_4$). In some embodiments, the insulating layer 113A may be deposited with a deposition thickness to completely fill the openings 601 with the dielectric material of the insulating layer 113A. In some embodiments, the insulating layer 113A may be formed by conformally depositing the dielectric material onto the second conductive layer 111 and into the openings 601 of the second conductive layer 111.

Figure 6E:
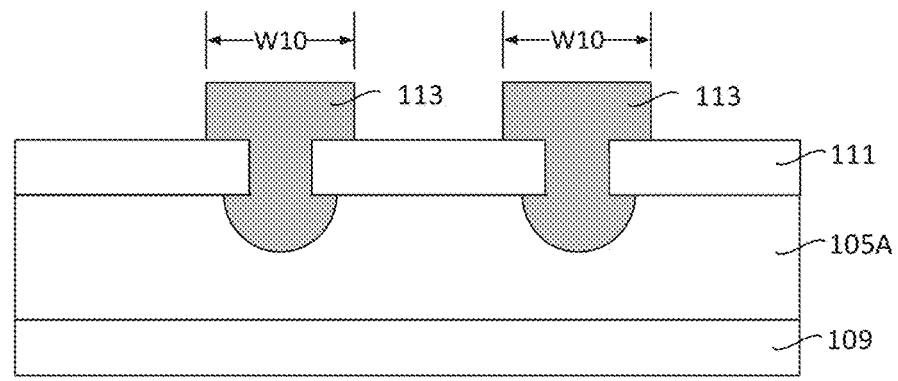

Referring to FIG. 6E, the insulating layer 113A is patterned to form segmentation structures 113. In some embodiments, the insulating layer 113A may be patterned using suitable photolithography and etching methods. In some embodiments, the segmentation structures 113 may have a width W10 between about 1 μm and about 3 μm.

Figure 6F:
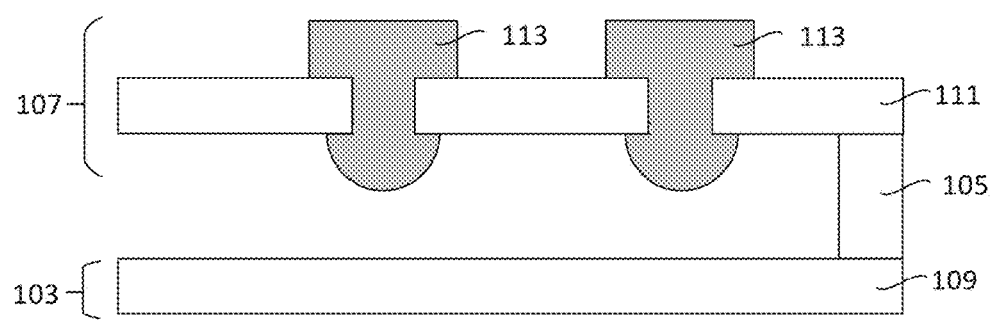

Referring to FIG. 6F, the support layer 105A is partially removed, such that a supporting element or spacer 105 remains in a peripheral (anchoring) area of the first conductive layer 109 and the second conductive layer 111. The first conductive layer 109 forms a first electrode structure 103, such as a membrane or diaphragm, of the capacitive MEMS device 100. The second conductive layer 111 and the segmentation structures 113 form a second electrode structure 107, such as a backplate or counter-electrode, of the capacitive MEMS device 100. Thus, FIG. 6F essentially shows a partial view of the border region of the capacitive MEMS device 100 illustrated in FIGS. 1A and 1B. In some embodiments where the second electrode structure 107 is perforated, a plurality of holes (such as the holes 115 illustrated in FIGS. 1A and 1B) are formed in the second conductive layer 111 before, during, or after forming the openings 601 in the second conductive layer 111.

Example embodiments of the invention are summarized in the following. Other embodiments can also be understood from the entirety of the specification and the claims filed herein.

Example 1

A MEMS device including: a membrane; a counter electrode structure spaced apart from the membrane, the counter electrode structure including a non-planar conductive layer; and an air gap between the membrane and the counter electrode structure, the air gap having a non-uniform thickness.

Example 2

The MEMS device of example 1, where the non-uniform thickness decreases from a center of the MEMS device to an edge of the MEMS device.

Example 3

The MEMS device of one of examples 1 and 2, where counter electrode structure has a plurality of holes.

Example 4

The MEMS device of one of examples 1 to 3, where the counter electrode structure includes a central region and a surrounding region, each of the central region and the surrounding region including a planar portion of the non-planar conductive layer.

Example 5

The MEMS device of example 4, where the central region of the counter electrode structure and the surrounding region of the counter electrode structure are concentric regions.

Example 6

The MEMS device of one of examples 4 and 5, where a first thickness of a first portion of the air gap between the central region of the counter electrode structure and the membrane is greater than a second thickness of a second portion of the air gap between the surrounding region of the counter electrode structure and the membrane.

Example 7

The MEMS device of one of examples 1 to 6, where the MEMS device is a MEMS microphone.

Example 8

A MEMS device including: a first movable electrode structure; a second movable electrode structure spaced apart from the first movable electrode structure, the first movable electrode structure and the second movable electrode structure enclosing a gap between the first movable electrode structure and the second movable electrode structure, the gap having a gas pressure lower than an ambient pressure; a static electrode structure within the gap and interposed between the first movable electrode structure and the second movable electrode structure; and a plurality of pillars extending through the gap and connecting the first movable electrode structure and the second movable electrode structure, the plurality of pillars extending through the static electrode structure, the plurality of pillars dividing the gap into a plurality of gap regions, different gap regions having different thicknesses.

Example 9

The MEMS device of example 8, where the plurality of pillars have a non-uniform pitch.

Example 10

The MEMS device of example 9, where the non-uniform pitch increases from a center of the MEMS device to an edge of the MEMS device.

Example 11

The MEMS device of one of examples 8 to 10, where a first gap region is closer to a center of the MEMS device than a second gap region, and where a first thickness of the first gap region is greater than a second thickness of the second gap region.

Example 12

The MEMS device of one of examples 8 to 10, where a first gap region is closer to a center of the MEMS device than a second gap region, and where a first thickens of the first movable electrode structure adjacent the first gap region is greater than a second thickens of the first movable electrode structure adjacent the second gap region.

Example 13

The MEMS device of example 12, where a third thickens of the second movable electrode structure adjacent the first gap region is greater than a fourth thickens of the second movable electrode structure adjacent the second gap region.

Example 14

The MEMS device of one of examples 8 to 13, where the first movable electrode structure has a non-uniform thickness.

Example 15

A MEMS device including: a first membrane; a second membrane spaced apart from the first membrane, the first membrane and the second membrane sealing a gap between the first membrane and the second membrane, the gap having a gas pressure lower than an ambient pressure; a counter electrode structure within the gap and between the first membrane and the second membrane, a first thickness of the gap adjacent a center of the counter electrode structure being greater than a second thickness of the gap adjacent an edge of the counter electrode structure; and a plurality of pillars within the gap and connecting the first membrane and the second membrane, the plurality of pillars extending through the counter electrode structure.

Example 16

The MEMS device of example 15, where the counter electrode structure has a perforated structure.

Example 17

The MEMS device of one of examples 15 and 16, where the plurality of pillars extend through holes in the counter electrode structure.

Example 18

The MEMS device of one of examples 15 to 17, where the plurality of pillars divide the gap into a plurality of gap regions, and where different gap regions have different widths.

Example 19

The MEMS device of one of examples 15 to 18, where the first membrane has a non-uniform thickness.

Example 20

The MEMS device of one of examples 15 to 19, where the second membrane has a non-uniform thickness.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A MEMS device comprising:
 a membrane;
 a counter electrode structure spaced apart from the membrane, the counter electrode structure comprising a non-planar conductive layer, the counter electrode structure comprising a central region and a surrounding region, the central region comprising a first planar portion of the non-planar conductive layer, the surrounding region comprising a second planar portion of the non-planar conductive layer, the first planar portion of the non-planar conductive layer being parallel to the second planar portion of the non-planar conductive layer; and
 an air gap between the membrane and the counter electrode structure, the air gap having a non-uniform thickness.
2. The MEMS device of claim 1, wherein the non-uniform thickness decreases from a center of the MEMS device to an edge of the MEMS device.
3. The MEMS device of claim 1, wherein the counter electrode structure has a plurality of holes.
4. The MEMS device of claim 1, wherein the central region of the counter electrode structure and the surrounding region of the counter electrode structure are concentric regions.

5. The MEMS device of claim 1, wherein a first thickness of a first portion of the air gap between the central region of the counter electrode structure and the membrane is greater than a second thickness of a second portion of the air gap between the surrounding region of the counter electrode structure and the membrane.

6. The MEMS device of claim 1, wherein the MEMS device is a MEMS microphone.

7. The MEMS device of claim 1, wherein a first width of the first planar portion of the non-planar conductive layer is greater than a second width of the second planar portion of the non-planar conductive layer.

8. A MEMS device comprising:
a first movable electrode structure;
a second movable electrode structure spaced apart from the first movable electrode structure, the first movable electrode structure and the second movable electrode structure enclosing a gap between the first movable electrode structure and the second movable electrode structure, the gap having a gas pressure lower than an ambient pressure;
a static electrode structure within the gap and interposed between the first movable electrode structure and the second movable electrode structure; and
a plurality of pillars extending through the gap and connecting the first movable electrode structure and the second movable electrode structure, the plurality of pillars extending through the static electrode structure, the plurality of pillars dividing the gap into a plurality of gap regions, different gap regions having different thicknesses, wherein the plurality of pillars have a non-uniform pitch.

9. The MEMS device of claim 1 wherein the non-uniform pitch increases from a center of the MEMS device to an edge of the MEMS device.

10. The MEMS device of claim 8, wherein a first gap region is closer to a center of the MEMS device than a second gap region, and wherein a first thickness of the first gap region is greater than a second thickness of the second gap region.

11. The MEMS device of claim 8, wherein a first gap region is closer to a center of the MEMS device than a second gap region, and wherein a first thickens of the first movable electrode structure adjacent the first gap region is greater than a second thickens of the first movable electrode structure adjacent the second gap region.

12. The MEMS device of claim 11, wherein a third thickens of the second movable electrode structure adjacent the first gap region is greater than a fourth thickens of the second movable electrode structure adjacent the second gap region.

13. The MEMS device of claim 8, wherein the first movable electrode structure has a non-uniform thickness.

14. The MEMS device of claim 8, wherein the second movable electrode structure has a non-uniform thickness.

15. A MEMS device comprising:
a first membrane;
a second membrane spaced apart from the first membrane, the first membrane and the second membrane sealing a gap between the first membrane and the second membrane, the gap having a gas pressure lower than an ambient pressure;
a counter electrode structure within the gap and between the first membrane and the second membrane, a first thickness of the gap adjacent a center of the counter electrode structure being greater than a second thickness of the gap adjacent an edge of the counter electrode structure; and
a plurality of pillars within the gap and connecting the first membrane and the second membrane, the plurality of pillars extending through the counter electrode structure, wherein the plurality of pillars divide the gap into a plurality of gap regions, and wherein different gap regions have different widths.

16. The MEMS device of claim 15, wherein the counter electrode structure has a perforated structure.

17. The MEMS device of claim 15, wherein the plurality of pillars extend through holes in the counter electrode structure.

18. The MEMS device of claim 15, wherein the first membrane has a non-uniform thickness.

19. The MEMS device of claim 15, wherein the second membrane has a non-uniform thickness.

20. The MEMS device of claim 15, wherein the plurality of pillars have a non-uniform pitch.

\* \* \* \* \*